United States Patent
Kub et al.

(10) Patent No.: US 6,242,324 B1
(45) Date of Patent: Jun. 5, 2001

(54) METHOD FOR FABRICATING SINGE CRYSTAL MATERIALS OVER CMOS DEVICES

(75) Inventors: Francis J. Kub, Arnold; Karl D. Hobart, Upper Marlboro, both of MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/371,782

(22) Filed: Aug. 10, 1999

(51) Int. Cl.$^7$ ........................................ H01J 21/30
(52) U.S. Cl. .................. 438/455; 438/67; 438/406; 438/458
(58) Field of Search ..................... 438/455, 458, 438/559, 57, 48, 69, 406; 267/431, 442

(56) References Cited

U.S. PATENT DOCUMENTS

| | | | |
|---|---|---|---|
| 4,039,116 | * 8/1977 | Chaffin, III | 228/123 |
| 5,013,681 | * 5/1991 | Godbey et al. | 438/459 |
| 5,235,195 | * 8/1993 | Tran et al. | 257/59 |
| 5,399,231 | * 3/1995 | McCarthy | 438/406 |
| 5,872,016 | * 2/1999 | Cunningham et al. | 438/37 |
| 5,910,012 | * 6/1999 | Takeuchi | 438/31 |
| 5,966,620 | * 10/1999 | Sakeguchi et al. | 438/455 |

OTHER PUBLICATIONS

Grovenor, C.R.M; Microelectronic Materials, Institute of Physics Publishing, Bristol, pp. 422–428.*
Omar, M.A.; Elementary Solid State Physics: Principles and Applications, Addison–Wesley, 1975, pp. 292–302.*

* cited by examiner

Primary Examiner—John F. Niebling
Assistant Examiner—Christopher Lattin
(74) Attorney, Agent, or Firm—John J. Karasek; Jane B. Marciniszyn (57) ABSTRACT

An aspect of the present invention is a method for making a functional active device (photodetector, laser, LED, optical modulator, optical switch, field effect transistor, MOSFET, MODFET, high electron mobility transistor, heterojunction bipolar transistor, resonant tunneling device, Esaki tunneling device etc.) disposed over a complementary metal oxide semiconductor (CMOS) device, having the steps; (a) forming an ultrathin compliant layer direct bonded to an oxide layer over said-CMOS device; (b) growing an epitaxial layer on said ultra-thin compliant layer (c) forming a functional active device in said epitaxial layer grown on said epitaxial layer that is grown on said ultrathin compliant layer; and (c) interconnecting said functional active device and said CMOS device, wherein said CMOS device is configured as either a readout circuit or a control circuit for said photodetector.

47 Claims, 4 Drawing Sheets

METHOD FOR FABRICATING SINGE CRYSTAL MATERIALS OVER CMOS DEVICES

BACKGROUND OF THE INVENTION

1. Field of the Invention

The present invention relates generally to methods for the growth of single crystal material layer on complementary metal oxide semiconductor (CMOS) devices.

2. Description of the Related Art

Single crystal materials are used in a number of applications that can be integrated with CMOS circuitry, including photodetectors, LEDs, lasers, resonant tunneling devices, SiGe MODFETs, silicon MOSFETs, ferroelectric sensors, etc. Devices fabricated in these single crystal materials are typically connected to CMOS circuitry either by wire bonding, flip chip bonding, or bump bonding. It is desirable to have the capability to form devices in single crystal material layers directly overtop of CMOS circuitry for a number of reasons. One example is that it is desirable to have photodetector current generating regions located above the CMOS circuitry because of improved photodetector fill factor (there will not be metal interconnects to block the absorption of photons and room needed for readout transistors at the pixel site) and also material layers with optimized optical absorption characteristics (different from the absorption characteristics of silicon needed to fabricated the CMOS circuitry) are desirable. It is desirable to have surface emitter lasers and edge emitter lasers formed directly overtop of CMOS circuitry to implement free space optical interconnects for transmitting digital data off of a CMOS circuit. It is desirable to have waveguide optical modulators and waveguide optical switches integrated directly over CMOS circuitry. In the case that the optical modulators and switches are integrated directly over CMOS circuitry, then there will be only be a small amount of parasitic capacitance that the CMOS circuitry has to drive and secondly, the CMOS circuitry can easily address a two dimensional array of optical switches and optical modulators. In all of the above examples, the ability to integrated photodetectors, lasers, optical modulators, optical switches directly over CMOS circuitry will lead to improved manufacturing process, lower manufacturing cost, and improved reliability compared to flip chip or bump bonding processes.

The typical way of processing a CMOS circuit is to cover the polysilicon gate electrodes and metal interconnects by an amorphous oxide layer or nitride layer. Because of the amorphous nature of the dielectric layer that covers the CMOS material layers, it is typically not possible to grow a single crystal material layer on top of an amorphous material (oxide or silicon nitride) layer over CMOS circuitry.

U.S. Pat. No. 5,374,564 to M. Bruel describes a method of fabricating silicon-on-insulator (SOI) layer that involves combining wafer bonding with a hydrogen implantation and separation technique. The hydrogen implantation and separation technique utilizes a heavy dose of implanted hydrogen together with subsequent annealing to produce H exfoliation that releases the host substrate to generate the SOI structure. The surface following exfoliation has a microroughness of about 8 nm, and must be given a slight chemomechanical polish to produce a prime surface. This step degrades the Si layer thickness uniformity and makes the process unsuitable for producing very thin Si films.

It has been found experimentally that there are a number of techniques to either reduce the required hydrogen ion implantation dose or to reduce the temperature needed to cause hydrogen ion implantation substrate layer splitting process to work. One technique involves the use of a high pressure nitrogen gas stream directed towards the side of a silicon substrate into which a high dose hydrogen ion implantation has been made. It has been experimentally found that the hydrogen ion implantation substrate layer splitting process can occur at room temperature for the case of a silicon substrate into which a high hydrogen ion implantation dose has been made using the high pressure nitrogen gas stream method. It has also been found experimentally that a helium ion implantation made in combination with a hydrogen ion implantation can be used to achieve a lower total implanted dose for the substrate layer splitting process to occur for a given anneal temperature. It has also been found experimentally that a lower substrate layer splitting temperature is achieved for the case that a hydrogen ion implantation is made into a silicon substrate having a high boron concentration. The high boron concentration can be incorporated into a silicon substrate by ion implantation. The lower temperature for hydrogen ion implantation substrate layer splitting to occur is obtained both for the case that the boron implant is annealed and for the case that the boron implant is unannealed.

One way that has been investigated for transferring thin layer of GaAs from one substrate to a second substrate is the epitaxial lift-off technique. In this approach, a GaAs layer is grown on top of a thin AlAs layer that is grown on a GaAs substrate. Thin layers of GaAs have been produced by lateral undercutting an AlAs layer in a dilute hydrofluoric acid etch and then transferring a GaAs epitaxial layer to another substrate using a thick wax to support the thin GaAs layer during the transfer operation. Typically, only small areas (<100 micrometer square) of thin GaAs can be transferred using the epitaxial lift-off techniques and thus is not suitable for full wafer transfer.

A second technique of transfer a single crystal layer to a second substrate is to use an etch stop technique. In the etch stop technique, the wafer is thinned from the backside to within approximately 50 micrometers of the etch stop layer and then the GaAs substrate is etched, stopping at an AlGaAs etch stop. The AlGaAs etch stop is next etched leaving a thin semiconductor layer. The etch stop technique suffers from non-uniform etching of the etch stop layer.

Present methods for growing heterojunction single crystal materials for use have significant shortcomings. The difference in lattice constant between two different single crystal layers can cause significant level of defects in an epitaxial layer grown on a substrate with a different lattice constant in the case that the critical thickness for a given lattice mismatch is exceeded. For instance, the most common method of growing HgCdTe on silicon is to grow CdTe on the <211> surface of silicon, and then to grow HgCdTe on the CdTe layer. However, this process results in a large number of crystal defects in the CdTe layer because of the large lattice mismatch between CdTe and silicon.

One way to reduce the effect of lattice mismatch in the growth of an epitaxial layer on a substrate with a different lattice constant is to use the concept of compliant substrates. Ultra-thin semiconductor layers are required for compliant substrates. In the compliant substrate approach, the ultra-thin semiconductor layer will expand or contract as a heteroepitaxially layer is grown on the surface of the ultra-thin semiconductor layer so that defects, if created, will reside in the ultra-thin semiconductor layer. The principal technique investigated to date for complaint substrate is the twist bonding technique. A second technique involves the use of a low viscosity material between the ultra-thin compliant layer and the handle substrate. Some examples of materials that become viscous at low temperature include boron oxide at approximately 450° C. In addition, metals, eutectics, and solders have a large range of melting temperatures ranging from 156° C. for indium to greater than 1000° C. for other metals. Glasses and oxides also have a wide range of melting temperatures ranging from below room temperature to greater than 1100° C. for fused quartz. The thin compliant layer will expand or contract during epitaxial layer growth and is susceptible to buckling of the thin compliant layer.

In order to direct bond two substrates, it is typically necessary that the surface roughness be less than 10 angstroms rms on each of the surfaces of the substrates. An approach that can be used to obtain less than 10 angstrom rms surface roughness on a CMOS circuit is to use chemical mechanical polishing of the amorphous oxide or nitride layer on the surface of the CMOS circuitry. There are a number of approaches that can be utilized to bond two substrates to reduce the requirement that the two substrate surfaces be polished to an RMS roughness of less than 1 nm. One approach is to deposit a material such as polysilicon, silicon dioxide, silicon nitride, or metal on the substrate surface, and then polish the material to a surface roughness of less than 1 nm RMS. The use of pressure, temperature, or vacuum separately or in combination also reduces the requirement to have a surface polishing of 1 nm or less. If one of the substrates is thin, then the thin substrate will more easily conform to the other substrate during bonding and thus reduce the requirement for surface roughness less than 1 nm RMS. Metals can be deposited on the substrate surface and the metals will bond to the second substrate surface with the help of pressure, temperature, and vacuum possibly by forming a eutectic with the second substrate material. Metals can be deposited on both substrate surfaces and bonded. Brazing or soft solder materials can be deposited on one or both surfaces and the substrates bonded. Preceramic polymers can be used to bond two substrates. Ceramic materials can be deposited on one or both substrate surfaces, the substrates heated to the melting point of the ceramic material sometime under pressure, and the two substrates bonded. Materials such as silicon and germanium that melt during bonding and react with the substrate material can be used to bond two SiC substrates together. Electrostatic or anodic bonding can be used to bond a substrate to an alkali containing glass material. In some cases, alkali containing glass can be deposited on one surface by sputter or evaporation and anodic bonding. A rough surface can be coated with a spin-on-glass to achieve a surface smooth enough for bonding. A low melting point frit or solder glass can be deposited on a surface and bonded to a second surface using pressure and temperature. A sodium silicate material deposited on a substrate surface will aid bonding. Bonding approaches that are appropriate for lower temperatures include polymer adhesive, organic adhesive, and epoxy bonding. The ambient is sometimes important during the bonding operation. For bonding of GaAs substrates, it is generally preferred to have a hydrogen ambient during bonding.

Because of reaction of metal interconnects with the silicon layer in the source and drain regions, the typically maximum temperature that a CMOS circuit can be exposed to is approximately 500° C. to 550° C. Some CMOS processes use barrier metals such as titanium tungsten between the metal interconnect and the silicon source and drain regions which will help prevent the interaction of the metal interconnects with the silicon source and drain regions. If metal interconnects are not present on the CMOS circuit, then the maximum temperature that a CMOS circuit can be exposed to is limited by the diffusion of the source and drain dopants and is approximately 900° C. to 1000° C. for a short time period. There are a number of epitaxial materials that can be grown at less than 500° C. to 550° C. temperature range including GaAs, GaSb, InGaAs, SiGe, CdTe, and HgCdTe.

Prior to epitaxial growth on a single crystal layer, there is typically a processing step to desorb native oxide from the single crystal layer. For a single crystal silicon layer, a anneal in an vacuum at approximately 500–550° C. for 15 seconds is needed to desorb the native oxide layer. For GaAs, an anneal of 500–550° C. for 15 seconds is also needed to desorb the native oxide layer.

Waveguide optical modulators and waveguide optical switches can be made using epitaxial growth of multiquantum well material layers on GaAs and InP single crystal substrates. These modulators typically operate as an electroabsorption waveguide modulator or utilize the Wannier-Stark effect to modulate the optical waveguide. A common multiquantum well material layer for modulators on InP substrate is InGaAsP/InP material system. The metal electrodes for modulating the electric field in the heterojunction material are typically arranged on the surface of the grown material. Ridge waveguides are typically formed by having higher index of refraction materials on the top and bottom surface of the waveguide and appropriately etching the semiconductor material.

Surface and edge emitter lasers are typically made in III-V material systems by appropriately confining the current flow and designing the index of refraction of the material layers to guide the reflections the generated laser light. The surface emitting laser typically requires a backside mirror layer.

Present methods for growing single crystal materials for use in these applications have significant shortcomings. For instance, the most common method of growing HgCdTe on silicon is to grow CdTe on the <211> surface of silicon, and then to grow HgCdTe on the CdTe layer. However, this process results in a large number of crystal defects in the CdTe layer, because of the large lattice mismatch between CdTe and silicon.

The most common way of making infrared focal plane arrays is to form HgCdTe detector material on one substrate, the CMOS readout circuitry on a second substrate, and to connect the CMOS readout circuitry to the infrared detector by bump bonding. Unfortunately, bump bonding has reliability problems, especially for large area detector arrays.

Infrared focal plane arrays can also be made by forming interconnects on the front side of the detector to CMOS readout circuitry, but the area taken up by the interconnects detracts from the packing density of detectors in these focal plane arrays.

Three-dimensional CMOS integrated circuits are desired for increased processing functionality. Processes that have been presented for fabrication of three-dimensional CMOS circuits (M. B. Kleiner, et. al., Thermal Analysis of Vertical Integrated Circuits" 1995 International Electron Device Meeting, pp. 487–490) have included the fabrication of CMOS circuits on separate wafers, the thinning of a CMOS wafer from the backside to approximately 10 micrometer thickness, the stacking of the thinned CMOS wafer on top of a second wafer using a glue as the bonding mechanism, and the formation of vias and metal interconnects from one wafer to the next wafer.

SUMMARY OF THE INVENTION

Accordingly, it is an object of this invention to provide a method for epitaxially growing single crystal material layer on complementary metal oxide semiconductor (CMOS) devices.

It is a further object of the invention to grow the single crystal material layer on complementary metal oxide semiconductor (CMOS) devices with high reliability, and without large numbers of crystal defects.

It is a further object of the invention to form single crystal material layer, including multiquantum well layers or heterojunction layers on complementary metal oxide semiconductor (CMOS) devices that can be used for functional active devices (photodetector, laser, LED, optical modulator, optical switch, field effect transistor, MOSFET, MODFET, high electron mobility transistor, heterojunction bipolar transistor, resonant tunneling device, Esaki tunneling device etc.) without the growth of an epitaxial layer on the single crystal layer.

It is a further object of this invention to provide infrared detectors for focal plane arrays with either frontside or backside contacts to CMOS readout circuits.

It is a further object of this invention to provide surface emitting lasers and edge emitting lasers with frontside or backside contacts to CMOS control circuits.

It is a further object of this invention to provide optical waveguide modulators and switches fabricated over CMOS circuits.

It is a further object of this invention to provide field effect transistors fabricated in single crystal layers formed over CMOS devices.

It is a further object of this invention to provide laterally tiled arrays (mosaic arrays) of single crystal material over CMOS devices for making photodetectors, lasers, light emitting diodes, optical modulators, optical switches over CMOS devices.

These and additional objects of the invention are accomplished by the structures and processes hereinafter described.

An aspect of the present invention is a method for making a functional active device disposed over a complementary metal oxide semiconductor (CMOS) device, having the steps; (a) forming an ultrathin compliant layer direct bonded to an oxide layer over said CMOS device; (b) growing an epitaxial layer on said ultra-thin compliant layer (c) forming a functional active device in said epitaxial layer grown on said epitaxial layer that is grown on said ultrathin compliant layer; and (c) interconnecting said functional active device and said CMOS device, wherein said CMOS device is configured as either a readout circuit or a control circuit for said photodetector.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

The following are incorporated by reference herein, in their entireties, and for all purposes:

(a) U.S. patent application Ser. No. 09/243,182, designated Navy Case No. 78,978, filed Feb. 1, 1999 by Kub et al., and (b) U.S. patent application Ser. No. 09/373,031, designated Navy Case No. 78,980, filed Jun. 27, 1999 by Kub et al.

(c) U.S. patent application Ser. No. 60/132,744, designated Navy Case No. 79,225, filed Apr. 1, 1999 by Kub et al.

(d) Kub et al., "ULTRA-THIN SILICON COMPLIANT LAYERS FOR INFRARED MATERIALS", 1998 Proc. of IRIS Materials and Detectors.

Ultra-thin semiconductor layers are required for compliant substrates. In structures with a compliant substrate, the ultra-thin semiconductor layer will expand or contract as a heteroepitaxially layer is grown on the surface of the ultra-thin semiconductor layer so that defects, if created, will reside in the ultra-thin semiconductor layer. The principal technique investigated to date for complaint substrate growth is the twist bonding technique and epitaxial growth on SOI substrates with thick ($\geq$100 nm) Si films.

As used in the art, compliant generally means that a layer will expand or contract during the epitaxial growth of another layer, to match the lattice constant of that layer, or that defects occurring during subsequent epitaxial growth will be confined to the compliant layer, and will not propagate into the epitaxially grown layer. It is desired to prepare compliant substrates for epitaxial growth that are thin enough to be compliant: they will expand upon heating, and slip relative to the other layers. In the present invention, this entails an ultra thin layer that is direct bonded to a low viscosity material layer such as oxides doped with boron, phosphorous, alkali ion, or lead, polymers with low glass transition temperatures, or metals with low melting temperatures. The use of these low viscosity oxide films with compliant substrates allows the oxide to "flow" and the compliant layer can then expand or contact to match the lattice constant of the epitaxial film. Alternately, the ultra-thin compliant layer can be weakly bonded, typically by van der Waals bonds, to a supporting substrate.

A single crystal layer, which may be a compliant layer, can be added to a CMOS device by direct bonding (or other bonding techniques), and full wafer splitting. Bonding and full wafer splitting is a technique for transferring a thin (<100 nm) or ultra-thin (<10 nm) layer of material from one wafer to another. In a typical example of this technique, hydrogen is implanted into a first substrate. This implanted hydrogen will vary in concentration, following a profile determined by the conditions of implantation. Thus, it is possible to implant hydrogen in a way that it will have an implant peak at a selected depth in the substrate. Typical implantation depths will range from about 50 nm to about 20,000 nm for an ion implanter tool with less than 200 KeV energy capability. A typical depth of about 800 nm into the first wafer may be effected by an implantation energy of about 90 keV, with a dose of about $5\times10^{16}$ cm$^{-2}$.

It has been found experimentally that there are a number of techniques to either reduce the required hydrogen ion implantation dose or to reduce the temperature needed to cause hydrogen ion implantation substrate layer splitting process to work. One technique involves the use of a high pressure nitrogen gas stream directed towards the side of a silicon substrate into which a high dose hydrogen ion implantation has been made. It has been experimentally found that the hydrogen ion implantation substrate layer splitting process can occur at room temperature for the case of a silicon substrate into which a high hydrogen ion implantation dose has been made using the high pressure nitrogen gas stream method. It has also been found experimentally that a helium ion implantation made in combination with a hydrogen ion implantation can be used to achieve a lower total implanted dose for the substrate layer splitting process to occur for a given anneal temperature. It has also been found experimentally that helium ion implantation can be used instead of hydrogen ion implantation for the substrate layer splitting process. It has also been found experimentally that a lower substrate layer splitting temperature is achieved for the case that a hydrogen ion implantation is made into a silicon substrate having a high boron concentration. The high boron concentration can be incorporated into a silicon substrate by ion implantation. The lower temperature for hydrogen ion implantation substrate layer splitting to occur is obtained both for the case that the boron implant is annealed and for the case that the boron implant is unannealed.

Preferably, the layer that has been implanted and the second wafer to which the first layer material is to be transferred, are prepared for bonding. The method of preparation will depend on the method of bonding. For direct bonding, the preparation steps will include cleaning the surfaces of organics by, e.g., treatment with RCA1, piranha, plasma, or UV ozone. The surfaces are then treated, if necessary, to have the desired surface chemistry for direct bonding. Direct bonding can take place between two hydrophilic surfaces (preferred), between two hydrophobic surfaces, or between a hydrophilic and a hydrophobic surface. A hydrophilic second wafer may have a native oxide surface (about 10 Å thick), or a grown oxide layer (typically $SiO_2$), or may be treated (chemically, by plasma treatment, etc.) to have surface —OH groups. Likewise, the ultra-thin layer being transferred may be treated to have a hydrophilic surface.

Hydrophilic/hydrophilic direct bonds are typically preferred, due to their good bond strength, especially for direct bonds formed at low temperatures (e.g., <500° C.). Other surface chemistries may be used, and skilled practitioners will employ known techniques to effect these chemistries, e.g., to provide hydrogen-terminated surfaces for hydrophobic chemistries.

The ultra-thin layer and the second wafer are brought into contact under conditions for forming a direct bond. Typically, this will entail pressure, and optionally elevated temperature (above room temperature). A low temperature anneal (typically between about 200° C. and about 300° C., preferably about 250° C.) is typically used to increase the direct bond strength. Pressure is especially useful if the surface is rough (e.g., ≧about 5 Å rms surface roughness). Typical pressures are on the order of ten to several hundred psi.

As an alternative to direct bonding, other bonding techniques may be used. For instance, the wafers may be bonded using anodic bonding, adhesive, polymer bonding, cold welding, soldered together, e.g., with an indium or tin solder, etc.

The structure is heated so the hydrogen (and/or other species) implanted in the first wafer expands, and thereby causes the first wafer to split along a cleavage line defined by the hydrogen implant peak. This leaves a portion of the first wafer, as well as the rest of the structure on the first wafer, attached to the second wafer.

If one desires to perform etching of this transferred wafer, this may be done at this time. Etching down to an ultra-thin layer can be performed, typically by the use of an etch-stop layer. Likewise, epitaxial growth on this transferred layer can be performed after the wafer splitting (and optionally after etching back).

Growing an Epitaxial Layer on a Compliant Layer on Planarized Oxide over CMOS Circuitry One particular use for the invention is the growth of an epitaxial layer on a compliant layer on planarized oxide over CMOS circuitry. This compliant layer will aid in subsequent epitaxial growth steps.

Figure 1:
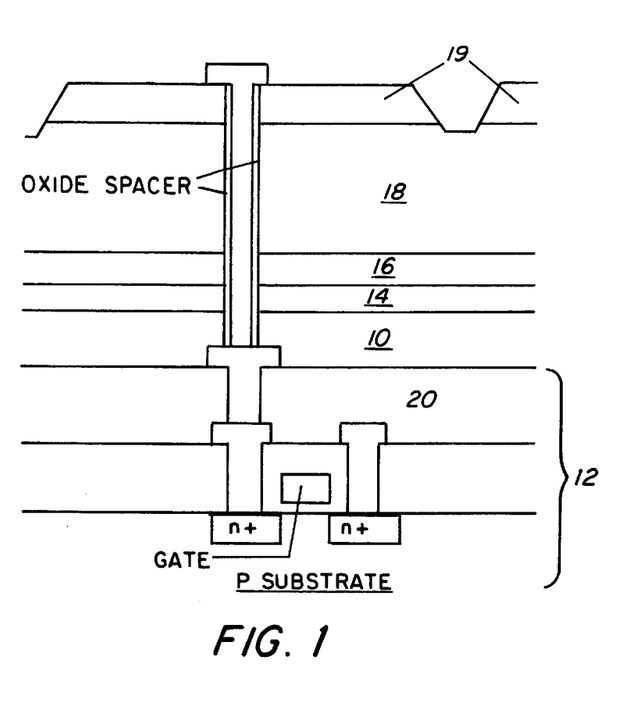
FIG. 1 shows a section of a CMOS device with an HgCdTe photodetector fabricated thereon.

Referring to FIG. 1, in an exemplary process the oxide layer 10 over top of the CMOS circuitry 12 is planarized using chemical mechanical polish (CMP). A thin (<2 nm) compliant <211> silicon layer 14 is direct wafer bond on the oxide surface. CdTe/HgCdTe material 16,18 is grown on the thin compliant semiconductor layer, HgCdTe photodetectors 19 are formed, possibly, directly overtop of the CMOS circuitry, and metal interconnects 20 are formed from the HgCdTe detectors down to the CMOS circuitry. Since one side of the bonding interface is an oxide layer, it ID will typically be necessary to use OH— van der Waals bonding, slippage at the semiconductor/oxide interface, or glasses with lower melting point as the mechanism for making the substrate compliant, and to allow the compliant layer to expand to accommodate the lattice mismatch of the additional epitaxial layer growth. It may also be necessary to have grooves etched in through the compliant layer at selected lateral separation to allow the compliant layer to expand and contract without buckling.

If the epitaxial layer growth temperature is sufficiently low, (~<400° C. to <500° C.), an alternative approach (because of concern about impurities and outgassing in vacuum system) to provide a compliant substrate may be to have the thin silicon layer bonded to a polymer layer that can expand to accommodate changes in lattice constant.

If metal is present on the CMOS wafer, then the maximum processing temperature for the hydrogen ion implant layer splitting and CdTe and HgCdTe growth is approximately 450° C. to 550° C. Typical growth temperatures are 320° C. for CdTe and 180° C. for HgCdTe. However, the typical way preparing a silicon surface that is free of oxide prior to epitaxial growth is to hydrogen terminate the silicon surface and then desorb the hydrogen in vacuum at temperatures of approximately 500° C. If no metal is present, then temperatures of 800° C. to 900° C. can generally be used. The metal interconnects could be added after the HgCdTe growth (there is a large advantage in detector fill factor by having CMOS metal interconnects beneath the detector).

Non-compliant Single-crystal Semiconductor on Top of CMOS Circuitry

Not all devices made according to the present invention will require compliant substrates. For applications where a compliant layer is not needed, a strongly bonded high temperature adhesive such as epoxy, ceramic adhesive, eutectic, perceramic polymer can by used to attach the <211> silicon layer to the oxide over the CMOS circuitry. It is possible to implement a resonant cavity HgCdTe photodetector by having a metal layer beneath the oxide that is beneath the HgCdTe material.

Compliant Layer on Planarized Poly-Silicon Layer over CMOS Circuitry

Figure 2:
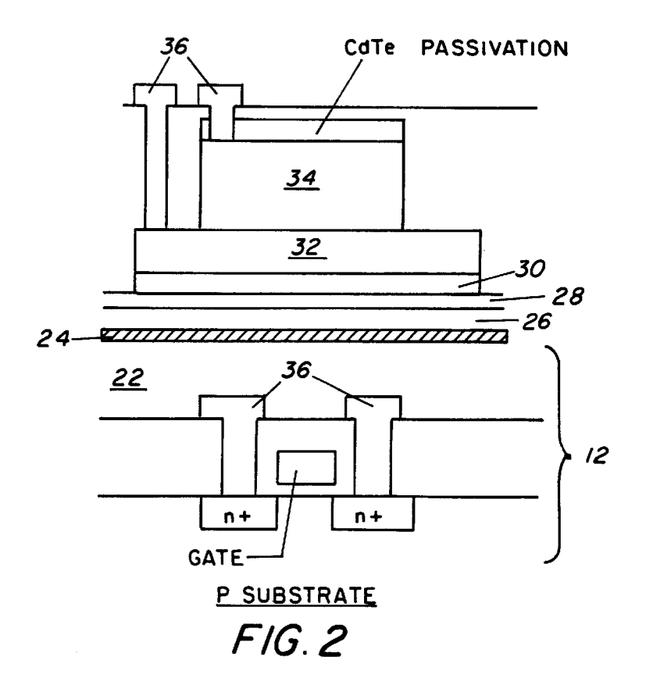
FIG. 2 shows a section of a compliant layer on a planarized poly-silicon layer over CMOS circuitry.

Referring to FIG. 2, a CMOS circuit 12 can be fabricated, and CVD oxide 22 deposited over the circuitry and planarized by CMP. A polysilicon layer 26 is deposited and CMP polished. Optionally, a metal reflector layer 24 for resonant cavity photodetection is deposited before the polysilicon. A thin compliant <211> silicon layer 28 is next weakly direct wafer bonded to a CMP polished polysilicon layer. CdTe/HgCdTe material 30,32 is grown on the thin compliant semiconductor layer, HgCdTe photodetectors 34 are formed possibly directly overtop of the CMOS circuitry, and interconnects 36 are formed from the HgCdTe detectors down to the CMOS circuitry.

The main difference compared to the approach described above and shown in FIG. 1 is that the surface of a polysilicon layer can be hydrogen terminated. In this case, it is possible to use hydrogen atom van der Waals bonding. In the approach shown in FIG. 1, at least the oxide surface has to be OH-terminated. The hydrogen terminated van der Waals bond strength is typically weaker than the OH— terminated van der Waals bond and for low temperature epitaxial growths, may be more optimum for compliant substrate than the OH— terminated van der Waals bond.

Electrical Contact to the Backside of the Detectors

It is desirable in general to be able to make electrical contact to the backside of the photodetector (as well as other devices) in order to achieve improved fill factor. For the typical way of growing HgCdTe photodetectors in which an insulating CdTe layer is grown first and then HgCdTe is grown on the CdTe, it is difficult to make electrical contact to the back side of the photodetector because of the insulating nature of the CdTe. Thus for CdTe/HgCdTe detectors, it is generally necessary to form electrical contacts from the top surface.

Figure 3:
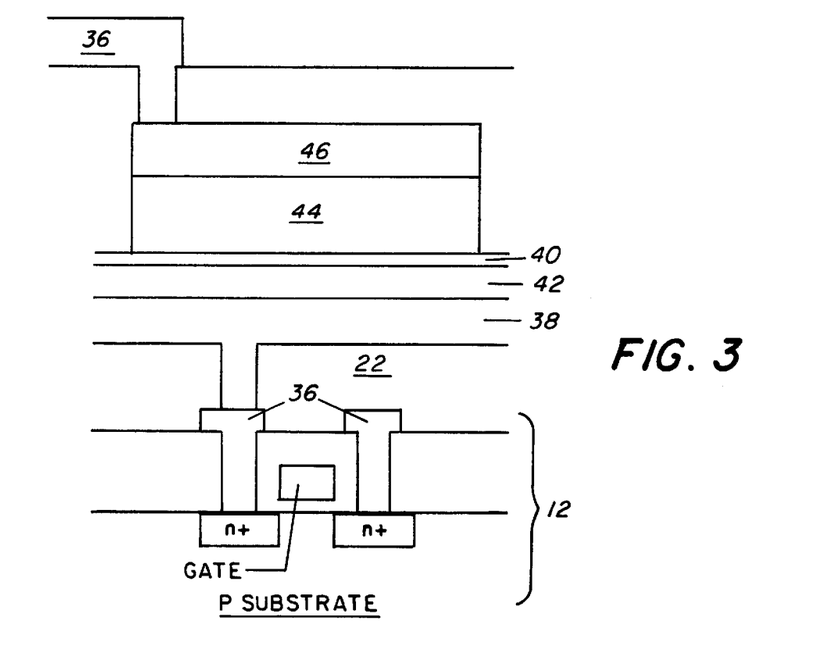
FIG. 3 shows a section of a CMOS device with an HgCdTe photodetector fabricated thereon, where the photodetector has a backside electrical contact to the CMOS device.

In the approach shown in FIG. 3, the CMOS circuitry 12 is fabricated and CVD oxide 22 is deposited over top of the circuitry and planarized using CMP. A metal layer 38 is next deposited. For the approach shown, it is desirable to be able to make electrical contact to the backside of the photodetector, however there has to be weak bonding to the thin <211> silicon compliant layer. Metals surface can be non-reactive, but yet electrically conductive if they are covered with a thin oxide layer 42 such as TiO or WO, however, if the processing temperature is too high, then strong bonding will occur between the metal and the thin <211> complaint silicon layer 40 which may prevent compliancy. Since the CdTe and HgCdTe growth temperatures are relatively low, there are a number of refractory metals or noble metals (such as gold) that will not react strongly with the <211> silicon and may be terminated with a conductive oxide such as tungsten oxide, titanium oxide. An alternate approach is to deposit a non-reactive, electrical conductive material on the metal at a temperature less than approximately 500° C. Candidate materials for the non-reactive electrical conductivity materials are silicides, MBE deposited doped poly or amorphous silicon, CdTe, HgCdTe, $InO_2$, $TnO_2$, or some other electrical conductive semiconductor or metal oxide material. Whether the metal surface or non-reactive deposited material approach is used, it is likely necessary that the surface be CMP polished to a small surface roughness.

A thin compliant <211> silicon layer 40 is next direct wafer bonded on the electrically conductive, non-reactive layer. CdTe/HgCdTe material 44, 46 is grown on the thin compliant semiconductor layer. HgCdTe photodetectors are formed possibly directly overtop of the CMOS circuitry, and interconnects are formed from the HgCdTe detectors down to the CMOS circuitry. In this case, since the thin semiconductor complaint layer is weakly bonded to the non-reactive layer, it is possible to use either hydrogen termination van der Waals bonding, or OH— van der Waals bonding, or slippage at the semi-conductor/oxide interface. The typical growth temperature for CdTe is 320° C. and for HgCdTe is 180° C., thus, it is highly likely that CdTe/HgCdTe can be grown on the <211> layer surface even with metal interconnects present on the CMOS circuitry. The <211> surface is typically hydrogen terminate to prevent native oxide from forming. The CdTe growth can be made without desorbing the hydrogen.

Non-compliant Single Crystal Semiconductor on Polysilicon on CMOS

Devices that are backside interconnected to CMOS devices are advantageous even without the use of compliant substrates. A relatively thick (~200 nm) <211> silicon layer implement by 'smart cut' and kiss polish or transferring a silicon layer from a silicon-on-insulator (SOI) wafer with etch stop can be direct bonded to the planarized oxide layer over top of the CMOS circuitry. For the cases where a compliant layer is not needed, a strongly bonded high temperature adhesive may be used, such as electrically conductive gold-silicon eutectics, or conductive epoxies. If a gold-silicon eutectic is used, then the top surface of the metal can be gold, and it is not necessary to use the polysilicon layer to form a gold-silicon eutectic.

Note that the approaches described herein have wide applicability whether or not a complaint layer is used. Other semiconductor thin (~<2 μm thick) single-crystal layers such as GaAs, InGaAs, Ge, InP can be bonded to the metal layer using the hydrogen layer splitting and kiss polish approach described above. The semiconductor material may have P-type and N-type doping layers already formed for making a PN diode detector, LED, or laser. If the thickness of the material is less than approximately 2 μm, then it is not necessary to grow additional epitaxial material on the semiconductor material that is bonded to the metal. If thicker epitaxial layers are required or possibly if the hydrogen ion implant causes too many defects in the semiconductor layer, then an additional epitaxial growth can be performed. An anneal is likely necessary to remove the defects caused by the hydrogen implant. If metal is present on the CMOS circuits, then an anneal temperature less than 500° C. is allowed.

Thin Single-Crystal Silicon Layer Bonded to Oxide over CMOS Circuitry

Figure 4:
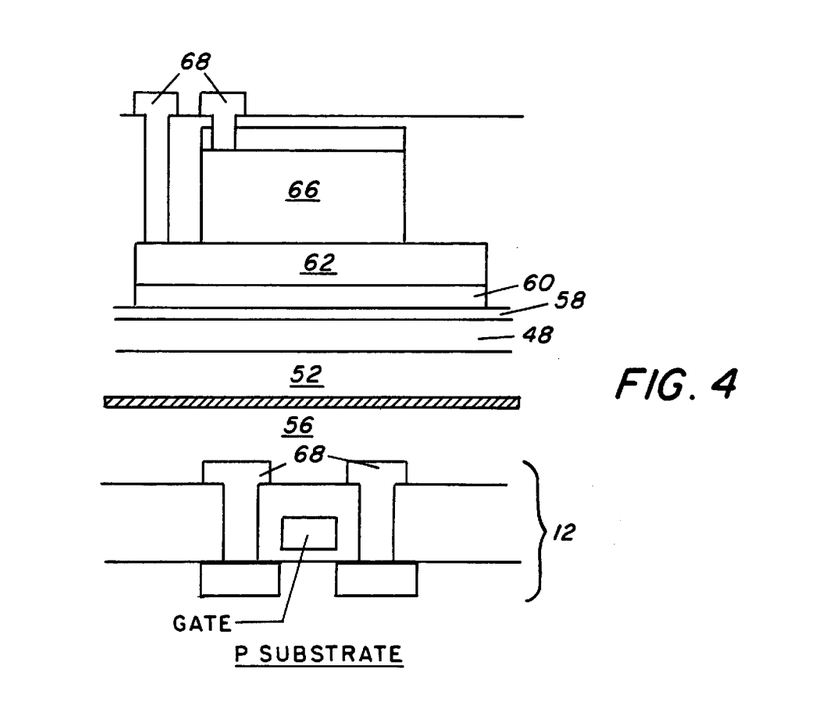
FIG. 4 shows a section of a thin single crystal silicon on top of an oxide layer over a CMOS device.
Figure 5:
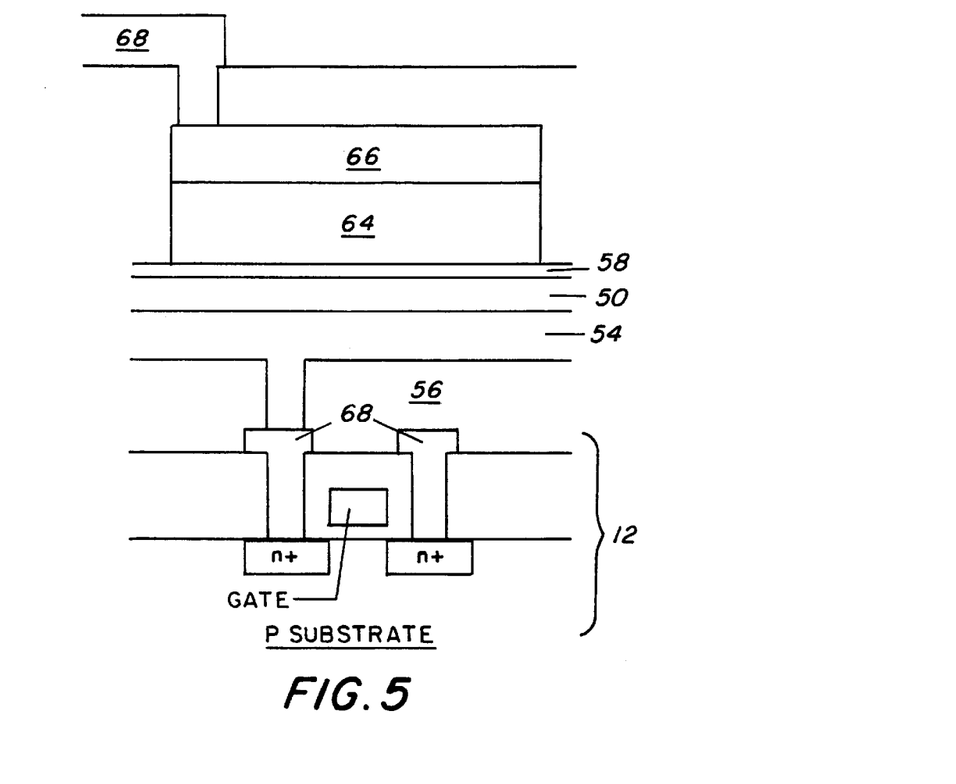
FIG. 5 shows a section of a thin single crystal silicon on top of a metal layer over a CMOS device.

This approach is similar to that discussed above in the context of FIG. 2, except that the polysilicon layer is replaced by a thin (200 nm–500 nm) single-crystal silicon layer 48, 50 as shown in FIGS. 4 and 5, respectively. The approach of having a single-crystal silicon layer on the surface is likely needed only in the case of 'twist bonding' approach to achieve a compliant substrate. To date, the 'twist bonding' compliant substrate approach has only been shown to work for the case that two single crystal semiconductor layer are bonded with a misorientation between the crystals. For the twist bonding to work, it is necessary that the surface be free of native oxide so that it is necessary to hydrogen terminate both the surface of a single crystal silicon bonded on the oxide and the surface of the <211> compliant substrate. The twist bonding approach requires high anneal temperatures and thus there likely can not be metal present on the CMOS wafer.

The thin single crystal silicon layer 48, 50 shown in FIGS. 4 and 5 respectively can be put on top of an oxide layer 52 as shown in FIG. 4 or on top of a metal layer 54 as shown in FIG. 5 using a 'smart cut' approach in which a hydrogen ion implant is made into the a silicon layer, the silicon bonded to the oxide or metal, the substrate split off by heating to cause the hydrogen gas to expand, and a kiss polish performed to obtain a small surface roughness. An alternate approach is to bond a SOI wafer over the CMOS circuitry and remove the silicon handle substrate and silicon oxide etch stop layer.

After forming the single-crystal silicon layer on top of the oxide 56 over the CMOS circuitry 12, a thin compliant <211> silicon layer 58 is next direct wafer bonded on the silicon surface, CdTe/HgCdTe material 60, 62; 64, 66 shown in FIGS. 4 and 5 respectively is grown on the thin compliant semiconductor layer, HgCdTe photodetectors are formed directly overtop of the CMOS circuitry, and interconnects 68 are formed from the HgCdTe detectors down to the CMOS circuitry.

Silicon Pedestals in Regions between CMOS Circuitry

Figure 6:
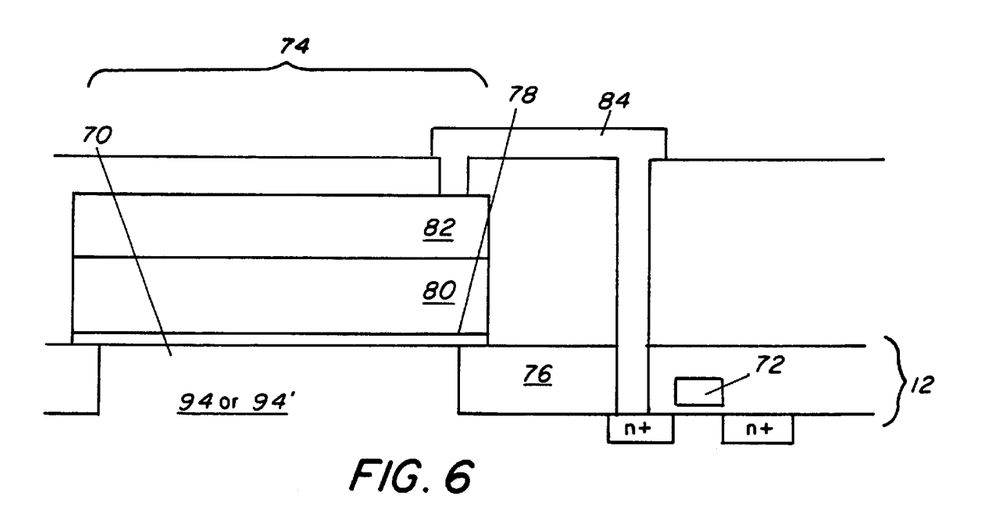
FIGS. 6 and 7 show sections of devices formed on pedestals.

The preferred approach to fabricate the pedestal 70 (approximately 700 nm high) shown in FIG. 6 is to fabricate the CMOS circuitry through the device isolation, gate, source/drain implants, and implant anneal. An oxide 72 is next deposited, an opening 74 in the oxide is etched to the silicon substrate, and approximately a 700 nm silicon layer is grown using selective epitaxy at a temperature less than approximately 800° C. After the pedestal is formed, oxide 76 is deposited and planarized approximately to the top of the silicon pedestal. The thin compliant <211> silicon 78 would then be direct bonded to the pedestals and then CdTe\HgCdTe 80, 82 is grown. Metal interconnects 84 would be formed after HgCdTe detector formation.

The main problems for fabricating CMOS circuitry with a pedestal present before device active regions are formed is that the pedestal can not be too tall or it will interfere with lithography of the CMOS circuits because of the limited depth of field of the lithography tools. The maximum height of the pedestal may be approximately 700 nm high. Also, it is not desirable to form CMOS circuit on an etched surface. Another approach may be to have a SOI wafer with 700 nm of top silicon layer, etch the silicon to the back oxide, etch the oxide, and form the CMOS circuit on the surface of the handle silicon.

It is to some advantage for using the silicon <100> for making electrical contact to the backside of the detector. Thus, alternate compliant substrate approachs include hydrogen termination and OH— termination for van der Waals bonding and twist bonding. For the case that non-electrical contact is made to the backside of the detector, than oxide can be present on the pedestal and candidate compliant substrate approaches include OH—van der Waals bonding and low melting point oxides or glasses may be candidate options.

Pedestal Formed on the <211> Compliant Substrate and Bonded to CMOS Wafer

Figure 7:
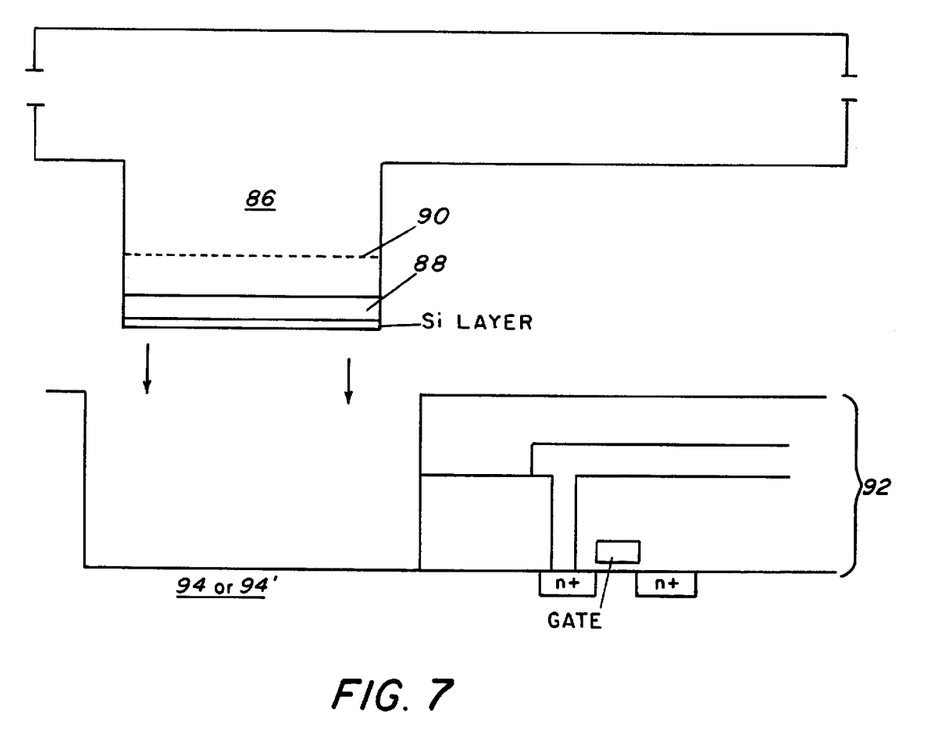

In this approach (FIG. 7), pedestals 86 are formed on the <211> wafers that contain a SiGe etch stop 88 and hydrogen ion implant splitting layer (SOI wafer with thin silicon and the use of oxide etch stop is another potential option). This wafer is then bonded to the CMOS wafer 92. The pedestals on the <211> wafer can be direct bonded to silicon single crystal regions 94 on the CMOS wafer or to flat oxide regions 94 on the CMOS wafer. After direct bonding, the wafer is heated at approximately 400–500° C. to cause the substrate to split off and the silicon etched to the SiGe etch stop and then the SiGe is etched as described in U.S. patent application Ser. No. 09/373,031. Thus, either the 'twist bonding' can be achieved for the case that the <211> wafer is direct bonded to the CMOS silicon substrate, or van der Waals bonding can be achieved.

In addition to van der Waals bonding and 'twist bonding' for compliant substrate, alternate approaches include vitreous flow of high boron concentration oxides, or low friction surface such as $MoS_2$. These layers can be deposited on the oxide over the CMOS circuitry and CMP polished The thin compliant <211> silicon layer can then be bonded to these surfaces.

Grooves Etched in <211> Substrate to Facilitate Compliant Substrate

For all of the foregoing methods, it will sometimes be desirable to fabricate grooves to allow the direct bonded layer to expand without buckling, as a way of providing compliancy.

In the case that a thin <211> layer is bonded to an oxide, poly-silicon, single-crystal layer on top of the oxide over the CMOS circuitry, a photolithography step would be used to align the grooves to the preferred location for the groove for forming photodetector elements by etching through the thin <211> layer and etching approximately 500 nm to 2000 nm into the polysilicon, metal, and/or oxide deposited over the CMOS circuitry. The CdTe and HgCdTe that are grown in the groove can be removed later using photosteps if needed.

For the case that the <211> compliant layer is formed on a separate substrate, deep grooves would be etched in this substrate, CdTe and HgCdTe grown and then this layer aligned bonded to the CMOS wafer to have the photodetectors in the correct location.

Obviously, many modifications and variations of the present invention are possible in light of the above teachings. It is therefore to be understood that, within the scope of the appended claims, the invention may be practiced otherwise than as specifically described.

What is claimed is:

1. A method for making a single crystal material disposed over one or more microelectronic transistor devices, comprising the steps of:

forming a thin single crystal layer direct bonded to an oxide layer over said one or more microelectronic transistor devices by ion implant layer splitting and processing to reduce surface roughness; and forming one or more single crystal layers over said thin single crystal layer by epitaxial growth.

2. The method of claim 1, wherein said processing to reduce surface roughness is done by polishing or chemical etching to an etch stop.

3. The method of claim 1, wherein said thin single crystal layer consists of multiple laterally tiled thin single crystal layers direct bonded over microelectronic transistor devices.

4. The method of claim 1, wherein said microelectronic transistor devices are selected from the group consisting of complementary metal oxide semiconductor (CMOS) devices, III-V MESFETS, III-V MODFETS, III-V HEMTs, SiGe MODFETs, III-V enhancement/depletion mode devices, III-V HBT devices, GaAs devices, InP devices, bipolar devices, tunnel diode devices, and silicon devices.

5. The method of claim 1, wherein said thin single crystal layer is an ultrathin layer.

6. The method of claim 5, wherein said ultrathin layer is a compliant layer.

7. The method of claim 1,
wherein said method is further a method for making a photodetector disposed over one or more microelectronic transistor devices;
wherein said epitaxial layer grown on said thin single crystal layer is the photocurrent generating layer for a photodetector layer; and
further comprising the step of interconnecting said photodetector and said one or more microelectronic transistor devices, wherein said microelectronic single crystal device is configured as a readout for said photodetector.

8. The method of claim 1,
wherein said method is further a method for making a functional active device disposed over one or more microelectronic transistor devices;
wherein said epitaxial layer grown on said thin single crystal layer is used in performing the function of said functional active device; and
further comprising the step of interconnecting said functional active device and said one or more microelectronic transistor devices, wherein said microelectronic transistor device is configured as a readout or controller for said functional active device.

9. The method of claim 1,
wherein said thin single crystal layer is selected from the group consisting of <211> silicon, <111> silicon, GaAs, InGaAs, Ge, InP, CdZnTe, and InSb.

10. The method of claim 7,
wherein said epitaxial layer photocurrent generating layer for a photodetector is selected from the group consisting of mercury, cadmium, tellurium (HgCdTe), indium phosphide (InP), indium gallium arsenide (InGaAs), germanium (Ge), silicon (Si), silicon germanium (SiGe), indium antimonide (InSb), gallium antimonide (GaSb), indium arsenide antimonide (InAsSb), and gallium arsenide (GaAs).

11. The method of claim 7,
wherein said photodetector is a HgCdTe photodetector; and
wherein said step of forming said photodetector further comprises growing a cadmium tellurium (CdTe) layer or ZnTe layer on said thin single crystal layer, and subsequently growing an HgCdTe layer on said CdTe or ZnTe layer.

12. The method of claim 6,
wherein said thin single crystal layer forms OH— van der Waals bonds with said oxide layer.

13. The method of claim 6,
wherein said oxide layer has a low viscosity at the epitaxial growth temperature for CdTe.

14. The method of claim 6,
wherein said one or more microelectronic transistor devices have an oxide cap layer thereon; and
wherein said compliant layer is adapted for slippage during epitaxial growth of CdTe.

15. The method of claim 14,
wherein said oxide cap layer is planarized prior to said step of forming an ultrathin compliant layer direct bonded to an oxide layer over said one or more microelectronic transistor devices.

16. A method for making a photodetector disposed over one or more microelectronic transistor devices, comprising:
forming a growth layer bonded to an oxide layer over said one or more microelectronic transistor devices;
forming a photodetector over said growth layer; and
interconnecting said photodetector and said one or more microelectronic transistor devices, wherein said one or more microelectronic transistor devices are configured as a readout for said photodetector.

17. A method for making a photodetector disposed over one or more microelectronic transistor devices, comprising:
forming a polysilicon layer on an oxide layer over said one or more microelectronic transistor devices;
forming an ultrathin compliant layer direct bonded to said polysilicon layer by layer splitting;
forming one or more a single crystal layers over said ultrathin compliant layer by epitaxial growth and forming a photodetector in said epitaxial growth layer; and
interconnecting said photodetector and said one or more microelectronic transistor devices, wherein said one or more microelectronic transistor devices is configured as a readout for said photodetector.

18. The method of claim 17,
wherein said polysilicon layer is hydrogen terminated prior to said step of forming an ultrathin compliant layer direct bonded to said polysilicon layer.

19. The method of claim 17,
wherein said step of interconnecting said photodetector and said one or more microelectronic transistor devices further comprises:
forming a conductive metal pathway from said one or more microelectronic transistor devices through said polysilicon layer;
forming a conductive interface over and in electrical contact with said conductive metal pathway, wherein said interface is adapted for electrically connecting said photodetector and said one or more microelectronic transistor devices, and wherein said interface is compliancy in said ultrathin compliant layer.

20. The method of claim 19,
wherein said interface comprises at least a first material selected from the group consisting of refractory metals.

21. The method of claim 20,
wherein said interface further comprises a TiO or WO coating over said first material.

22. The method of claim 19
wherein said wherein said interface comprises a material selected from the group consisting of suicides, MBE-deposited doped polycrystalline silicon, MBE-deposited doped amorphous silicon, CdTe, HgCdTe, $InO_2$, and $SnO_2$.

23. A method for making a photodetector disposed over one or more microelectronic transistor devices, comprising:
forming a single crystal semiconductor layer bonded to an oxide layer over said one or more microelectronic transistor devices;
forming a photodetector over said single crystal semiconductor layer; and
interconnecting said photodetector and said one or more microelectronic transistor devices, wherein said one or more microelectronic transistor devices is configured as a readout for said photodetector.

24. The method of claim 23, wherein said single crystal semiconductor layer is selected from the group consisting of <211> silicon, <111> silicon, GaAs, InGaAs, Ge, InP, CdZnTe, and InSb.

25. The method of claim 23, wherein said single crystal semiconductor layer is bonded to said oxide layer by a gold-silicon eutectic bond.

26. The method of claim 23, wherein said single crystal semiconductor layer is a doped layer.

27. A method for making a photodetector disposed over one or more microelectronic transistor devices, comprising:

forming a single crystal silicon layer having a thickness between 200 nm and 500 on an oxide layer over said one or more microelectronic transistor devices;

forming an ultrathin compliant layer direct bonded to said single crystal silicon layer;

forming a photodetector over said ultrathin compliant layer; and interconnecting said photodetector and said one or more microelectronic transistor devices, wherein said one or more microelectronic transistor devices is configured as a readout for said photodetector.

28. The method of claim 27, wherein said compliant layer forms a twist bond between said single crystal silicon layer and said photodetector.

29. A method for making a photodetector connected to one or more microelectronic transistor devices, comprising:

forming an oxide layer over said one or more microelectronic transistor devices;

etching though said oxide layer in an area adjacent to said one or more microelectronic transistor devices;

growing a silicon pedestal in said etched area;

forming an oxide layer over said silicon pedestal;

forming an ultrathin compliant layer direct bonded to said oxide layer over said silicon pedestal;

forming a photodetector over said ultrathin compliant layer; and interconnecting said photodetector and said one or more microelectronic transistor devices, wherein said one or more microelectronic transistor devices is configured as a readout for said photodetector.

30. A method for making a photodetector connected to one or more microelectronic transistor devices, comprising:

forming an oxide layer over said and in an area adjacent to said one or more microelectronic transistor devices;

forming an ultrathin compliant layer direct bonded to said oxide layer, in said area adjacent to said one or more microelectronic transistor devices;

growing a silicon pedestal on said ultrathin compliant layer;

forming an oxide layer over said silicon pedestal;

forming a photodetector on said oxide layer over said silicon pedestal; and interconnecting said photodetector and said one or more microelectronic transistor devices, wherein said one or more microelectronic transistor devices is configured as a readout for said photodetector.

31. The method of claim 6, further comprising the step of forming grooves in said compliant layer, for permitting said compliant layer to laterally expand without buckling during heating.

32. The method of claim 1, wherein said method is further a method for making an optical waveguide disposed over one or more microelectronic transistor devices, said waveguide configured for transmission perpendicular to a growth axis; and wherein said waveguide further comprises an optical switch for modulating said transmission.

33. The method of claim 4, wherein said method is further a method for making a optical waveguide modulator disposed over one or more microelectronic transistor devices, said waveguide configured for transmission perpendicular to a epitaxial layer growth axis;

wherein said epitaxial layer or layers grown on said thin single crystal layer is the optical waveguide confining layer and optical modulating layer; and further comprising the step of interconnecting said optical waveguide modulator and said one or more microelectronic transistor devices, wherein said CMOS device is configured as a controller for said optical modulator.

34. The method of claim 33, wherein said epitaxial and thin single crystal layers are bounded on upper and lower surfaces by layers having higher indices of refraction, for confining optical energy within said epitaxial and thin single crystal layers.

35. The method of claim 33, wherein controlling electrodes are located above and below said optical waveguiding material, with said layers with higher indices of refraction interposed between said electrodes and said optical waveguiding material.

36. The method of claim 4, wherein said method is further a method for making a surface emitting laser disposed over one or more microelectronic transistor devices, said surface emitting laser configured for transmission parallel to a epitaxial layer growth axis;

wherein said thin single crystal layer or said epitaxial layer or layers grown on said thin single crystal layer is the optical light photon generating region for the surface emitting laser; and wherein said epitaxial layer grown on said single crystal layer or said single crystal layer can be the backside optical mirror for the surface emitting laser; and further comprising the step of interconnecting said surface emitting laser and said one or more microelectronic transistor devices, wherein said CMOS device is configured as a controller for said laser.

37. The method of claim 4, wherein said method is further a method for making an edge emitting laser disposed over one or more Microelectronic transistor devices, said edge emitting laser configured for transmission perpendicular to a epitaxial layer growth axis;

wherein said thin single crystal layer or said epitaxial layer or layers grown on said thin single crystal layer is the optical light photon generating region for the edge emitting laser; and further comprising the step of interconnecting said edge emitting laser and said one or more microelectronic transistor devices, wherein said CMOS device is configured as a controller for said laser.

38. The method of claim 4, wherein said method is further a method for making an light emitting diode disposed over one or more microelectronic transistor devices, said light emitting diode configured for transmission parallel to an epitaxial layer growth axis;

wherein said thin single crystal layer or said epitaxial layer or layers grown on said thin single crystal layer is the optical light photon generating region for the light emitting diode; and further comprising the step of interconnecting said light emitting diode and said one or more microelectronic transistor devices, wherein said CMOS device is configured as a controller for said laser.

39. A method for making a single crystal material disposed over one or more microelectronic transistor devices, comprising:

forming a thin single crystal layer direct bonded to an oxide layer over said one or more microelectronic transistor devices by ion implant layer splitting.

40. The method of claim 39, wherein said method is further a method for making a photodetector disposed over one or more microelectronic transistor devices;

wherein said single crystal layer is the photocurrent generating layer for a photodetector; and further comprising the step of interconnecting said photodetector and said one or more microelectronic transistor devices, wherein said microelectronic transistor device is configured as a readout for said photodetector.

41. The method of claim 39, wherein said method is further a method for making one or more a lateral conducting field effect transistor disposed over one or more microelectronic transistor devices;

wherein said single crystal layer is a layer in which the lateral current conducting channel resides which is modulated by voltage applied to the gate to enable the operation of a field effect transistor; and further comprising the step of interconnecting said laterally conducting field effect transistor and said one or more microelectronic transistor devices.

42. The method of claim 39, wherein said method is further a method for making a optical waveguide disposed over one or more microelectronic transistor devices;

wherein said single crystal layer is the optical confining layer for a photodetector; and further comprising the step of interconnecting said photodetector and said one or more microelectronic transistor devices, wherein said microelectronic transistor device is configured as a readout for said photodetector.

43. The method of claim 4, wherein said method is further a method for making an optical waveguide modulator disposed over one or more microelectronic transistor devices, said waveguide configured for transmission perpendicular to a epitaxial layer growth axis;

wherein said single crystal layer is the optical waveguide confining layer and optical modulating layer; and further comprising the step of interconnecting said optical waveguide modulator and said one or more microelectronic transistor devices, wherein said CMOS device is configured as a controller for said optical modulator.

44. The method of claim 43, wherein said single crystal layer is bounded on upper and lower surfaces by layers having higher indices of refraction, for confining optical energy within said single crystal layer.

45. The method of claim 4, wherein said method is further a method for making a surface emitting laser disposed over one or more microelectronic transistor devices, said surface emitting laser configured for transmission normal to CMOS wafer surface;

wherein said single crystal layer or layers is the optical light photon generating region for the surface emitting laser;

wherein said single crystal layer or layers can be the backside optical mirror for the surface emitting laser; and further comprising the step of interconnecting said surface emitting laser and said one or more microelectronic transistor devices, wherein said CMOS device is configured as a controller for said laser.

46. The method of claim 4, wherein said method is further a method for making an edge emitting laser disposed over one or more microelectronic transistor devices, said edge emitting laser configured for transmission parallel to single crystal layer surface;

wherein said single crystal layer or layers is the optical light photon generating region for the edge emitting laser, and further comprising the step of interconnecting said edge emitting laser and said one or more microelectronic transistor devices, wherein said CMOS device is configured as a controller for said laser.

47. The method of claim 4, wherein said method is further a method for making an light emitting diode disposed over one or more microelectronic transistor devices, said light emitting diode configured for transmission normal to the single crystal surface;

wherein said single crystal layer or layers is the optical light photon generating region for the light emitting diode; and further comprising the step of interconnecting said light emitting diode and said one or more microelectronic transistor devices, wherein said CMOS device is configured as a controller for said laser.

* * * * *